US007462920B2

United States Patent
Tang et al.

(10) Patent No.: US 7,462,920 B2
(45) Date of Patent: Dec. 9, 2008

(54) VERIFICATION ARCHITECTURE OF INFRARED THERMAL IMAGING ARRAY MODULE

(75) Inventors: Shiang-Feng Tang, Longtan Township, Taoyuan County (TW); Chen-Der Chiang, Taipei (TW); Ping-Kuo Weng, Longtan Township, Taoyuan County (TW); Chih-Chang Shih, Longtan Township, Taoyuan County (TW); Yau-Tang Gau, Taipei (TW); Jiunn-Jye Luo, Longtan Township, Taoyuan County (TW); San-Te Yang, Pingjhen (TW)

(73) Assignee: Chung Shan Institute of Science and Technology, Armaments Bureau, M.N.D., Taoyuan County (TW)

( * ) Notice: Subject to any disclaimer, the term of this patent is extended or adjusted under 35 U.S.C. 154(b) by 198 days.

(21) Appl. No.: 11/604,314

(22) Filed: Nov. 27, 2006

(65) Prior Publication Data

US 2008/0121944 A1  May 29, 2008

(51) Int. Cl.
*H01L 31/00* (2006.01)
(52) U.S. Cl. ............... 257/443; 257/214; 257/E31.001; 250/332
(58) Field of Classification Search ........... 257/214, 257/443, 183.1, E27.129, E29.071, E31.001; 324/753, 765, 501; 356/51; 374/129; 250/332
See application file for complete search history.

(56) References Cited

U.S. PATENT DOCUMENTS

2005/0017176 A1 * 1/2005 Koch et al. ............... 250/338.4
2005/0104089 A1 * 5/2005 Engelmann et al. ......... 257/204

* cited by examiner

*Primary Examiner*—Evan Pert
*Assistant Examiner*—Selim Ahmed
(74) *Attorney, Agent, or Firm*—Rosenberg, Klein & Lee

(57) ABSTRACT

The present invention relates to a verification architecture of an infrared thermal imaging array module, which includes the following steps. Perform specification design of thermal imaging module, epitaxy, and verification of optical characteristics for calibrating epitaxial parameters. Perform a fabrication process of single-device-type sensing device and verification of changing-temperature optoelectronic measurement by measuring and calibrating at low temperatures by changing temperatures and voltages. Perform a fabrication process of focal-plane array and verification of optoelectronic uniformity and test for dark-current uniformity. Perform a fabrication process and verification of jointing and thinning the focal-plane array and the ROIC. The focal-plane sensing module and the ROIC are jointed by indium bonding, and optoelectronic signal conversion is performed using the sensing array module. Perform the verification of integrated test on thermal image quality. Optimum driving and controlling output parameters are tuned for performing analysis and test on thermal image quality of the module. Manufacture the prototype of the thermal imaging array module, which is jointed with the focal-plane sensing array by indium bonding. Thereby, the prototype of the thermal imaging array module is completed.

19 Claims, 6 Drawing Sheets

VERIFICATION ARCHITECTURE OF INFRARED THERMAL IMAGING ARRAY MODULE

FIELD OF THE INVENTION

The present invention relates generally to an infrared thermal imaging array module, and particularly to a verification architecture of an infrared thermal imaging array module and a method for manufacturing the same.

BACKGROUND OF THE INVENTION

Over the past decade, in order to satisfy special the requirements of various thermal image applications, high-quality infrared thermal imaging array modules are developed in selecting materials for sensing array modules, optimizing design of device structures, and enhancing thermal imaging resolution and detectivity. For example, in 2002, Masalkar et al. of Japan (US 20020088943A1) proposed improvements on fabrication architecture of multi-quantum wells in sensing structures as well as simplified fabrication steps for enhancing sensing efficiency of sensing devices. In 2004, Jeffrey B. Barton of US (US 20040061056A1) proposed a novel near-infrared photodetecting architecture by using indium phosphide substrates, and proposed an improved method of module fabrication for using in a detecting array architecture. In 2005, Michael G. Engelmann of US (US 20050104089A1) proposed an improved structure of an array-type image sensing module for visible and near-infrared light in large-pixel-count high-resolution applications. In the same year, Frederick E. Koch (US 20050017176A1) proposed for the first time thermal imaging applications by combining a quantum-dot infrared photodetector focal-plane array module and a CMOS signal read-out circuit architecture.

Overall, the development of a thermal imaging module needs technical personnel specialized in various expertises. For example, a complete infrared thermal imaging array module includes epitaxy and design of sensing device arrays, which requires expertises of physics, optoelectronic materials, and material epitaxy, an array-type optical-signal read-out integrated circuit (ROIC) unit, which requires expertises of integrated circuit design and analog and digital electronics, a thermal-image calibration circuit, which requires expertises of design of logic circuits and image circuits, and optimum integration and debugging of overall module, which needs personnel specialized in image system verifications. In the past, while integrating technological developments, performance optimization and verification are performed only in individual professional fields. A concrete verification flow for infrared image-sensing modules and an integrated method for manufacturing the same are not proposed.

Accordingly, the present invention proposes a verification architecture of an infrared thermal imaging array module and a method for manufacturing the same. According to the present invention, the drawbacks of traditional thermal image-sensing materials, heterojunctions, imaging architectures, and manufacturing processes are improved. In addition, the present invention can be applied in different thermal image-sensing materials, heterojunctions, imaging architectures, and manufacturing processes. Furthermore, according to the present invention, the debugging efficiency of developing various thermal imaging array modules is enhanced.

SUMMARY

The purpose of the present invention is to provide a verification architecture of an infrared thermal imaging array module and a method for manufacturing the same, which can enhance performance and sensing efficiency of a sensing array module.

Another purpose of the present invention is to provide a verification architecture of an infrared thermal imaging array module and a method for manufacturing the same, which can reduce research and development costs effectively.

The verification architecture of an infrared thermal imaging array module and a method for manufacturing the same according to the present invention include the following steps. Perform specification design of thermal imaging module, epitaxy, and verification of optical characteristics for calibrating epitaxial parameters. If the verification is passed, perform a fabrication process of single-device-type sensing device and verification of changing-temperature optoelectronic measurement, which includes gluing the completed epitaxy on an insulating base with heat-conducting glue when epitaxy is completed, leading connection pins by gold wires via coaxial cables or low-noise cables, measuring dark currents, dark resistance, and frequency response at low temperatures by changing temperatures and voltages, and calibrating detectivity. If the verification is passed, perform a fabrication process of focal-plane array and verification of optoelectronic uniformity thereof, otherwise, return back to specification design of thermal imaging module, epitaxy, and verification of optical characteristics. When the verification is passed, continue to perform a fabrication process of focal-plane array and verification of optoelectronic uniformity thereof for complying with the specifications of sensing devices, wherein the fabrication flow includes using single-device-type parameters for manufacturing the array, and then selecting testing regions for testing uniformity of dark currents. If the verification is passed, perform a fabrication process and verification of jointing and thinning the focal-plane array and a read-out integrated circuit (ROIC), otherwise, return back to specification design of thermal imaging module, epitaxy, and verification of optical characteristics.

When the verification is passed, continue to perform the fabrication process and verification of jointing and thinning the focal-plane array and the ROIC. The focal-plane sensing module and the ROIC are jointed by indium bonding, and optoelectronic signal conversion is performed using the sensing array module. If the verification is passed, perform verification of integrated test (including optomechanical system) on thermal image quality, otherwise, return back to the fabrication process of focal-plane array and verification of optoelectronic uniformity thereof.

When the verification is passed, continue to perform the verification of integrated test (including optomechanical system) on thermal image quality. Optimum driving and controlling output parameters are tuned for performing analysis and test on thermal image quality of the module. If the verification is passed, manufacture a prototype of the thermal imaging array module, otherwise, return back to the fabrication process and verification of jointing and thinning the focal-plane array and the ROIC.

When the verification is passed, continue to manufacture the prototype of the thermal imaging array module, which is jointed with the focal-plane sensing array by indium bonding. The optical current in each of the array unit is stored to the integration capacitor signal so that row- and column-multiplexers can send signals sequentially to a sensor buffer board module and an image processing system via signal output terminals for performing image signal processing. Thereby, the prototype of the thermal imaging array module is completed. Accordingly, the performance of the sensing array module can be enhanced, and verification cycle time for the sensing modules can be shortened.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
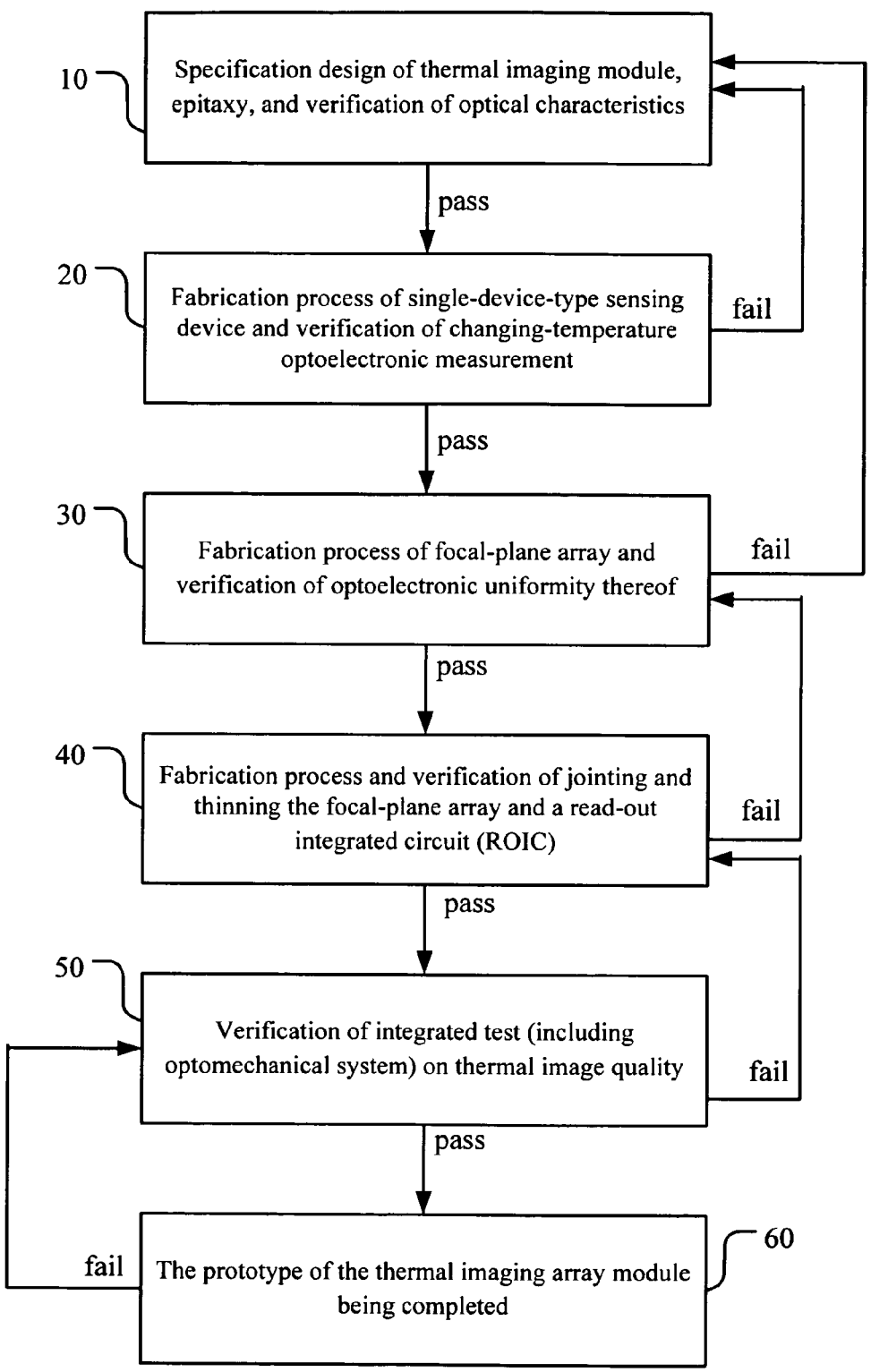
FIG. 1 shows a flowchart of a verification architecture of an infrared thermal imaging array module according to a preferred embodiment of the present invention.

FIG. 1 shows a flowchart of a verification architecture of an infrared (IR) thermal imaging array module according to a preferred embodiment of the present invention. As shown in the figure, the present invention includes performing specification design of thermal imaging module, epitaxy, and verification of optical characteristics 10 for calibrating epitaxial parameters, which includes a sensing frequency band, using short, middle, and long IR absorption frequency bands, a sensing module IR transmission substrate 102, selecting quality of the sensing module, namely, influencing IR transmission rate of receiving frequency band, a bottom heavily-doped contact layer 104, influencing quality of the ohmic contact between semiconductor and conducting metal, an IR absorption layer, namely, an active layer 106, the periodicity thereof influencing photoconductivity gain and quantum efficiency, an intrinsic layer, namely, a depletion layer 108, the thickness and intrinsic concentration thereof influencing quantum efficiency and dark current of the sensing device, an energy-barrier blocking layer 110, influencing intrinsic impedance of the sensing device for complying with high-injection photo-current efficiency, dark current of the sensing device, and activation energy under operation temperatures, and a top heavily-doped contact layer 112, influencing characteristics of ohmic contact and output efficiency of photo-electron current.

If the verification is passed, perform a fabrication process of single-device-type sensing device and verification of changing-temperature optoelectronic measurement 20, which includes gluing the completed epitaxy on an insulating base with heat-conducting glue when epitaxy is completed, leading connection pins by gold wires via coaxial cables or low-noise cables, measuring dark currents, dark resistance, and frequency response by changing temperatures and voltages, and calibrating detectivity. If the verification is passed, perform a fabrication process of focal-plane array and verification of optoelectronic uniformity thereof 30, otherwise, return back to specification design of thermal imaging module, epitaxy, and verification of optical characteristics 10. When the verification is passed, continue to perform a fabrication process of focal-plane array and verification of optoelectronic uniformity thereof 30 for complying with the specifications of sensing devices, wherein the fabrication flow includes using single-device-type parameters for manufacturing the array, and then selecting testing regions for testing uniformity of dark currents. If the verification is passed, perform a fabrication process and verification of jointing and thinning the focal-plane array and a read-out integrated circuit (ROIC) 40, otherwise, return back to specification design of thermal imaging module, epitaxy, and verification of optical characteristics 10.

When the verification is passed, continue to perform the fabrication process and verification of jointing and thinning the focal-plane array and the ROIC 40. The focal-plane sensing module and the ROIC are jointed by indium bonding, and optoelectronic signal conversion is performed using the sensing array module. A signal sample and hold unit 418 is stored in an integration capacitor 1020, that is, the sensed signal-to-noise ratios (SNR), is input to an injection unit 412. The injection unit 412 injects charge signal in the integration capacitor 1020 to an output terminal. An amplifier module unit amplifies the signal. A row-414 and a column-multiplexer 416 sense locations of units and extract sequentially. A timing generation and control unit 420 controls access time and signal integration time from a main timing 426. If the verification is passed, perform verification of integrated test (including optomechanical system) on thermal image quality 50, otherwise, return back to the fabrication process of focal-plane array and verification of optoelectronic uniformity thereof 30.

When the verification is passed, continue to perform the verification of integrated test (including optomechanical system) on thermal image quality. Optimum driving and controlling output parameters are tuned for performing analysis and test on thermal image quality of the module. The focal-plane array and ROIC chip module, a filter, and a cold shielding tube are placed in a low-temperature vacuum cryogenic chamber 502, jointing with an IR lens from outside. A sense buffer board module 524 is the interface driving module between the focal-plane array and ROIC chip module and the image processing module. A video processing circuit module 526 processes and outputs image data signals. A control processor 522 controls the whole commands and image signal output, and is connected to a main computer. If the verification is passed, manufacture a prototype of the thermal imaging array module 60, otherwise, return back to the fabrication process and verification of jointing and thinning the focal-plane array and the ROIC 40.

When the verification is passed, continue to manufacture the prototype of the thermal imaging array module 60, which is jointed with the focal-plane sensing array by indium bonding. The optical current in each of the array unit is stored to the integration capacitor signal so that row- and column-multiplexers can send signals sequentially to a sensor buffer board module and an image processing system via signal output terminals for performing image signal processing. Thereby, the prototype of the thermal imaging array module us completed.

Figure 2A:
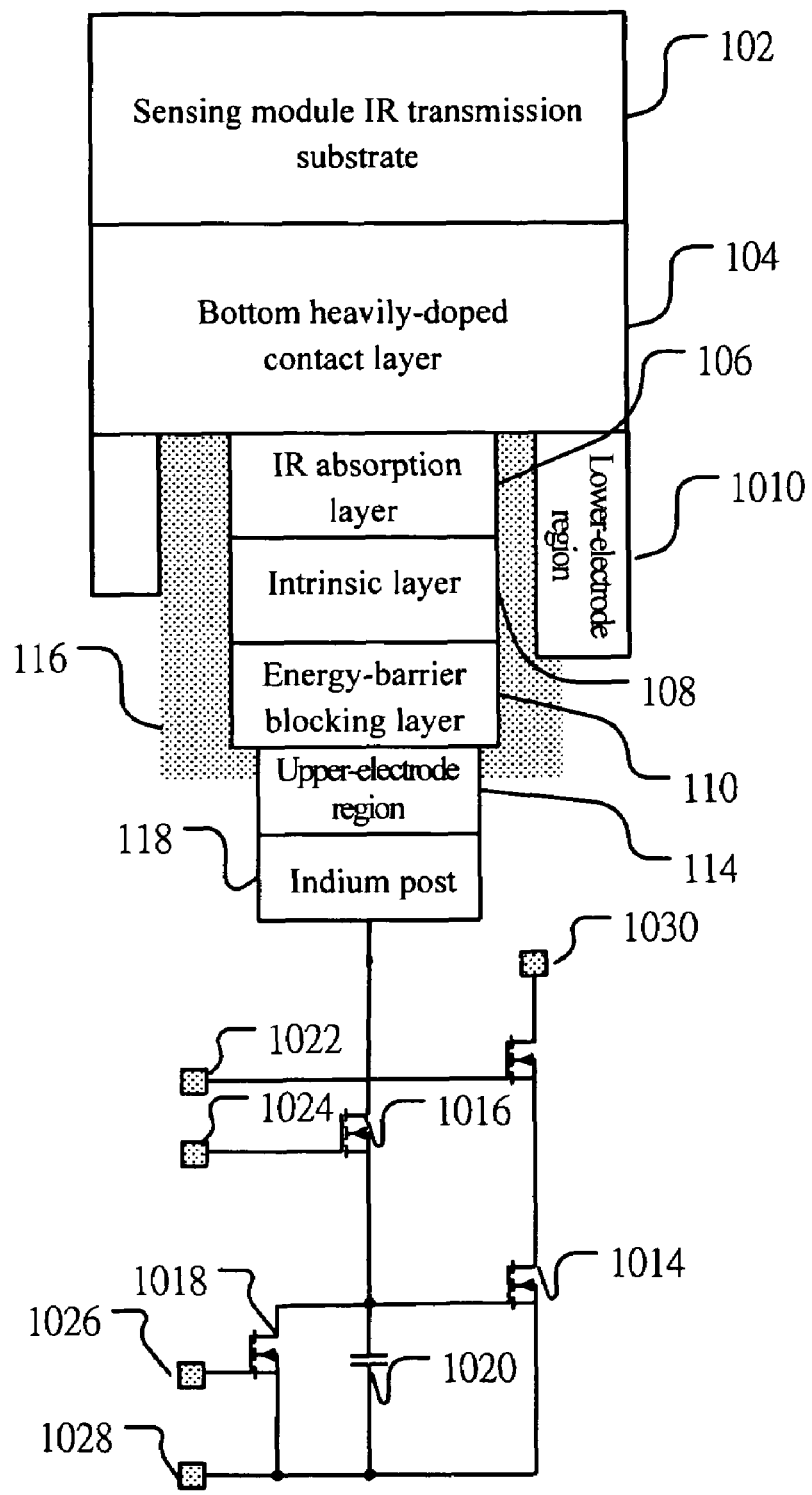
FIG. 2a shows a structural schematic diagram of an infrared thermal imaging array module according to a preferred embodiment of the present invention.

FIG. 2a shows a structural schematic diagram of an infrared thermal imaging array module according to a preferred embodiment of the present invention. As shown in the figure, the specification design of thermal imaging module, epitaxy, and verification of optical characteristics 10 according to the present invention use designed parameters to define structure of the IR sensing device required by the thermal imaging array module in the specifications. The preferred fabrication processes for device structures includes Molecular Beam Epitaxy (MBE), Metal Organic Chemical Vapor Deposition (MOCVD), or High-Temperature Diffusion Oven (HTDO). If the IR absorption layer 106 is designed as a quantum confined structure, such as quantum wells and quantum dots, then MBE or MOCVD is preferred.

On the contrary, if the sensing structure is mainly the bulk-type P-N or P-I-N structure, MBE or MOCVD is usually used to grow N- and I-layers, and then P-layer is grown by using HTDO. The used substrate can be IV family, such as Silicon (Si), or III-V family, such as GaAs or InP. The sensing material, periodicity, and thickness are $Si/Si_zGe_{1-z}$ (z=0.1~0.5, 10~40 nm/1~10 nm, 10~50 cycles), $Al_xGa_{1-x}As/GaAs$ (x=0.1~0.5, 10~40 nm/1~10 nm, 10~50 cycles), and $Al_xGa_{1-x}As/In_yGa_{1-y}As/GaAs$ (x=0.1~0.5, y=0.1~0.3, 10~40 nm/1~5 nm/1~10 nm, 10~50 cycles). The bulk-type sensing materials are InSb, MCT, and InP. The P-layer in a P-I-N structure with an intrinsic layer (I-layer, thickness: 0~5 μm) is formed by HTDO. The diffusion material of the P-layer can be ZnAs compound, Zn, or Cd with thickness 1~3 μm.

Before growing sensing devices with MBE, MOCVD, or HTDO, it is necessary to first calibrate epitaxial parameters, for example, material deposition rate, periodicity structure completeness, quality of structural crystals, and polarity and doping concentration. The descriptions described above are design flow of epitaxial structures, verification of epitaxial parameters and sensing device structure of the sensing device module structure. Afterwards, cut off a portion (around ¼~⅕ of the whole wafer) of the same sensing device epitaxial wafer for performing a fabrication process of single-device-type sensing device and verification of changing-temperature optoelectronic measurement 20, which is used to verify the differences in optoelectronic characteristics and qualities between the fabricated epitaxial sensing device structure and the designed device structure.

In the fabrication process of single-device-type sensing device, the error between photomasks and linewidth of physical devices is less than 10%. When performing verification of changing-temperature optoelectronic measurement, the error rate under 10~300K operation temperatures is less than 15%. The resultant spectrum type uniformity is greater than 80%. An appropriate etching solution is mixed (containing weakly acid low-PH solution: Hydrogen Peroxide: Deionized (DI) water=2~5:1~2:5~20). The etching depth is the thickness between the upper layer of the layered device structure and the layer producing electron-hole pairs (around 1~10 μm). The purpose is to avoid lateral leakage currents. If the device is planar-typed, high-temperature diffusion can be used to diffuse the P-layer (diffusion depth is 0.5~5 μm), and then surface polishing (aluminum oxide with diameters 1~5 μm: Deionized water=1:2~5) is used to polish to 0.25~2 μm for forming the most appropriate P-layer. The non-device region is I-layer for stopping lateral spreading of currents. Thereby, the photocurrents are confined within the main structure of the device and the contact electrode regions for achieving maximum quantum efficiency.

Next, silicon oxide (SiOx) or silicon nitride (SiNx) is formed with thickness 50~300 nm to be the surface passivation layer 116 of the sensing device by using Plasma Enhance Chemical Vapor Depositon (PECVD, substrate temperature is 300~500° C.), Plasma Vapor Depositon (PVD, substrate temperature is 80~200° C.), ion sputtering (normally, inert gases such as He or Ar is used), or evaporation method. Then, Reactive Ion Etching (RIE) or wet etching (Buffer HF:DI water=1~5:20) is used to define the region where semiconductor contacts metal. The material of contact metal used by the upper- 114 and lower-electrodes 1010 in such kind of sensing devices can be Pd 1~20 nm/Cr 1~20 nm/Au—Ge Alloy 50~300 nm/Au 50~300 nm if it is N-type, and can be Pd 1~20 nm/Cr 1~20 nm/Au—Be Alloy or Zn 50~300 nm/Au 50~300 nm if it is P-type. Evaporation, electron-gun evaporation, or ion sputtering processes can be used to fabrication the metal electrodes.

Rapid Thermal Annealing (RTA) is a process for forming preferred ohmic contact between semiconductor and metal. The stable temperature and time are 350~500° C. for 15~60 sec, respectively. The temperature-ramping rate is 100~200° C./sec. If the sensing device is mesa-typed, in addition to defining etching regions by using photomasks, the depth of the etching region needs to exceed the bottom heavily doped region by ⅓~½ in thickness. The other processed are the same as planar-typed device. In the process for sensing devices with quantum well structure, it is necessary to add periodic grating structure after the process of defining mesa-typed sensing device regions. The structure thereof is one-dimensional stripe-shaped, or two-dimensional rectangular or rhombus-shaped. The spacing and height of the grating are 1~5 μm and 10~500 nm, respectively. The etching method is the same as the process for mesa-type sensing device regions. The description above is the main steps of the fabrication process for a single-device-type sensing device. The purpose thereof is to use the process parameters as the reference parameters for manufacturing a focal-plane array structure.

After the single-device-type sensing device structure is completed, glue the structure onto an insulating test base (such as a aluminum oxide carrier base) using heat-conducting glue. Lead the upper and lower signal terminals by using gold wires, and put it into a circulating liquid helium cryogenic temperature-changing vacuum chamber. Then, lead out the pin signal wires via a feedthrough interface with coaxial wire or low-noise signal wires. Measure dark currents, dark resistance, and frequency response by changing temperatures and voltages (for example: using FTIR spectrum analyzer: incident light source, performing Fourier transform to give absorption spectrum distribution; low-noise current amplifier: performing voltage setup, signal detectivity, and gain amplification), and calibrate detectivity (for example: black radiation source: calibrating FTIR light intensity; phase-locked loop: modulating synchronously photoelectronic current and converting it to voltage signal for extraction). After the above measurements of photoelectronic physical parameters and verification, if the specifications of the sensing device is satisfied, for example, signal-to-noise ratio, photoresponse frequency band, responsibility, detectivity, dark current, dark differential resistance, then the rest ¾~⅘ area of the same sensing epitaxial wafer uses an array-typed photomask.

Afterwards, perform directly a fabrication process of focal-plane array. The linewidth error for each of detecting unit uniformity is less than 10%, and the total photocurrent uniformity in spectrum response is greater than 75%. The process flow adopts the original single-device-type parameters for manufacturing the array. At last, add a device testing area for performing test on dark current uniformity 13. If the sensing array is manufactured using low bandgap sensing materials, such as indium antimonide or MCT, it is necessary to grow, for example, a silicon oxide or silicon nitride passivation layer (with thickness 50~300 nm), on the surface of the sensing array with plasma- or ultra-violet-light-assisted vapor deposition, or with thermal vacuum deposition, or to spin-coat a polymer layer (with thickness 0.5~3 μm) on the array layer. The main purpose is to prevent penetration of exterior vapor or pollutant, which would affect sensing quality due to lateral dark current formed by increase of surface impurity levels.

Figure 2B:
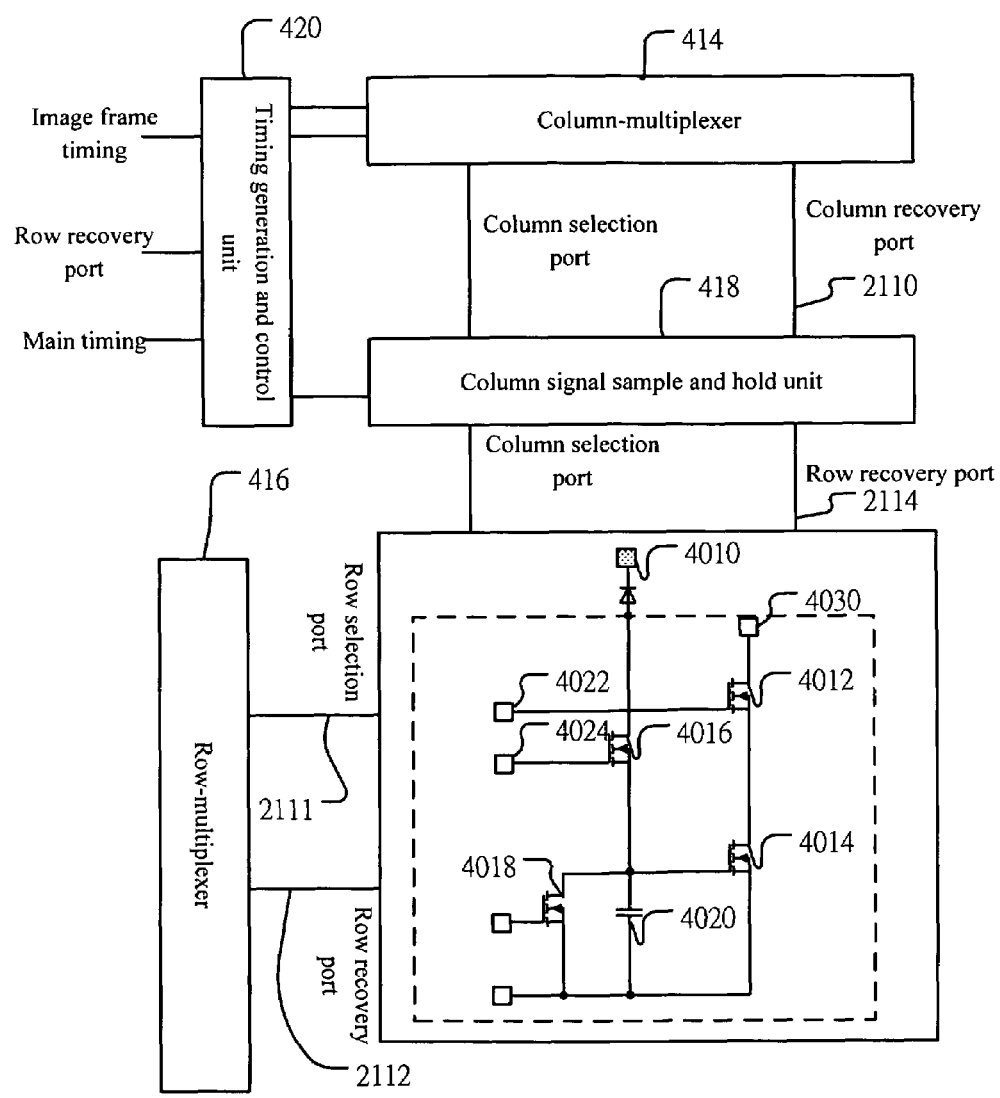
FIG. 2b shows a structural schematic diagram of an infrared thermal imaging array module according to a preferred embodiment of the present invention.

FIG. 2b shows a structural schematic diagram of an infrared thermal imaging array module according to a preferred embodiment of the present invention. As shown in the figure, what follows is growing an indium post 118 (with height 3~12 μm, bottom area thereof being smaller than the metal electrode region) on upper and lower metal electrodes. By using pressing and plate heating method (temperature 90~200° C.), at the moment when the indium post is close to its melting point, the indium post is jointed with the ROIC by indium bonding. Next, perform glue-filling and solidifying processes (for example, polymer), then the complete focal-plane array and ROIC architecture is finished. In the figure, a single unit of the focal-plane array and ROIC architecture with n×n pixels is shown. The main function of the ROIC is to convert and extract photoelectric signals. The architecture thereof is that each pixel corresponds to a set of integration unit, which can perform buffering, direct injection, gate modulation, capacitor transimpedance and amplification. Thereby, increase of the supporting strength between the focal-plane array sensing device architecture and the ROIC module is desired. In addition, stress caused by polishing process should be released properly.

Figure 3:
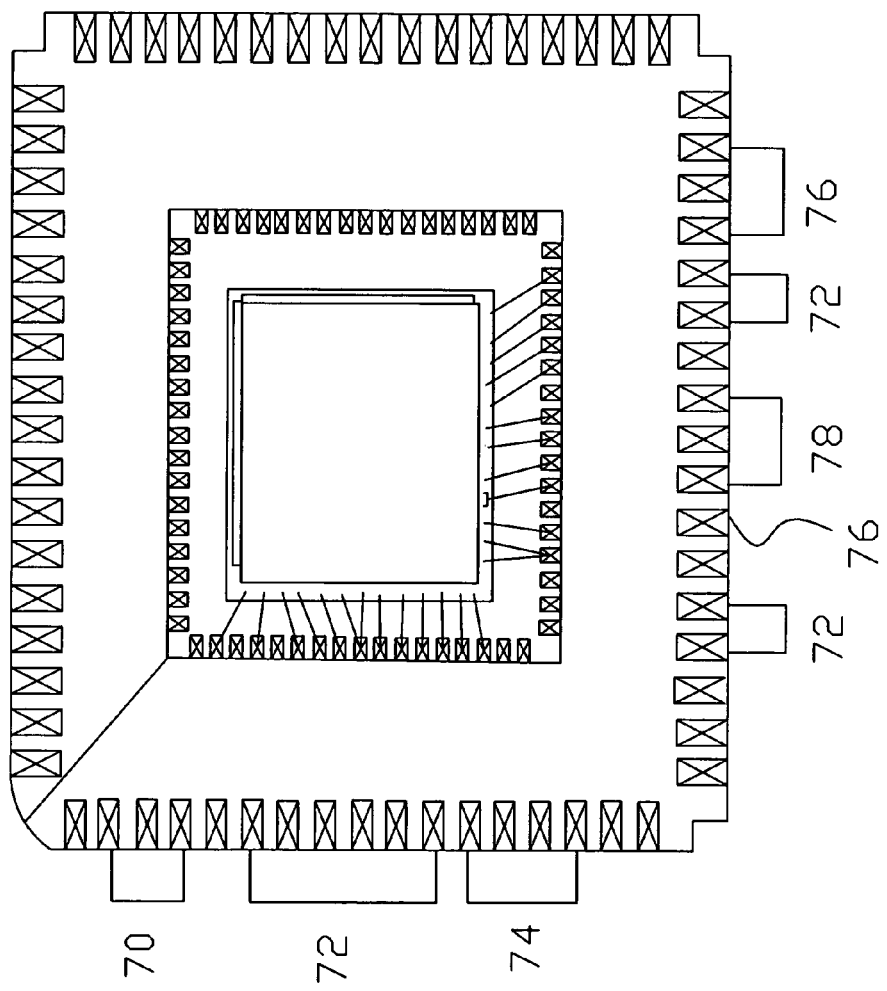
FIG. 3 shows a planar view of an infrared thermal imaging array module according to a preferred embodiment of the present invention.

In the glue-filling process, first protect the portion of the focal-plane array module that needs not to be glue-filled by photoresist. Then, immerse it into polymer glue until bubbles stopping appearing from the interface between the sensing device array and the ROIC. Pick it out to a dish and dry it in a dry cabinet for at least 8~12 hours. After that, use organic solution, such as acetone and chloroform, to eliminate the protecting photoresist and residual glue on the focal-plane array module. At last, as FIG. 3 shows, glue the module to a 68- or 84-pin chip base using heat-conducting glue, just like the case for the single-device-type sensing chip. Wiring of the pins on the base corresponds to the sensing transform output signal 70, the power signal 72, the clock and synchronously driven input and output signal 74, the operating temperature detecting signal 78, and testing diode signal 76 in the focal-plan array and the ROIC.

Figure 4:
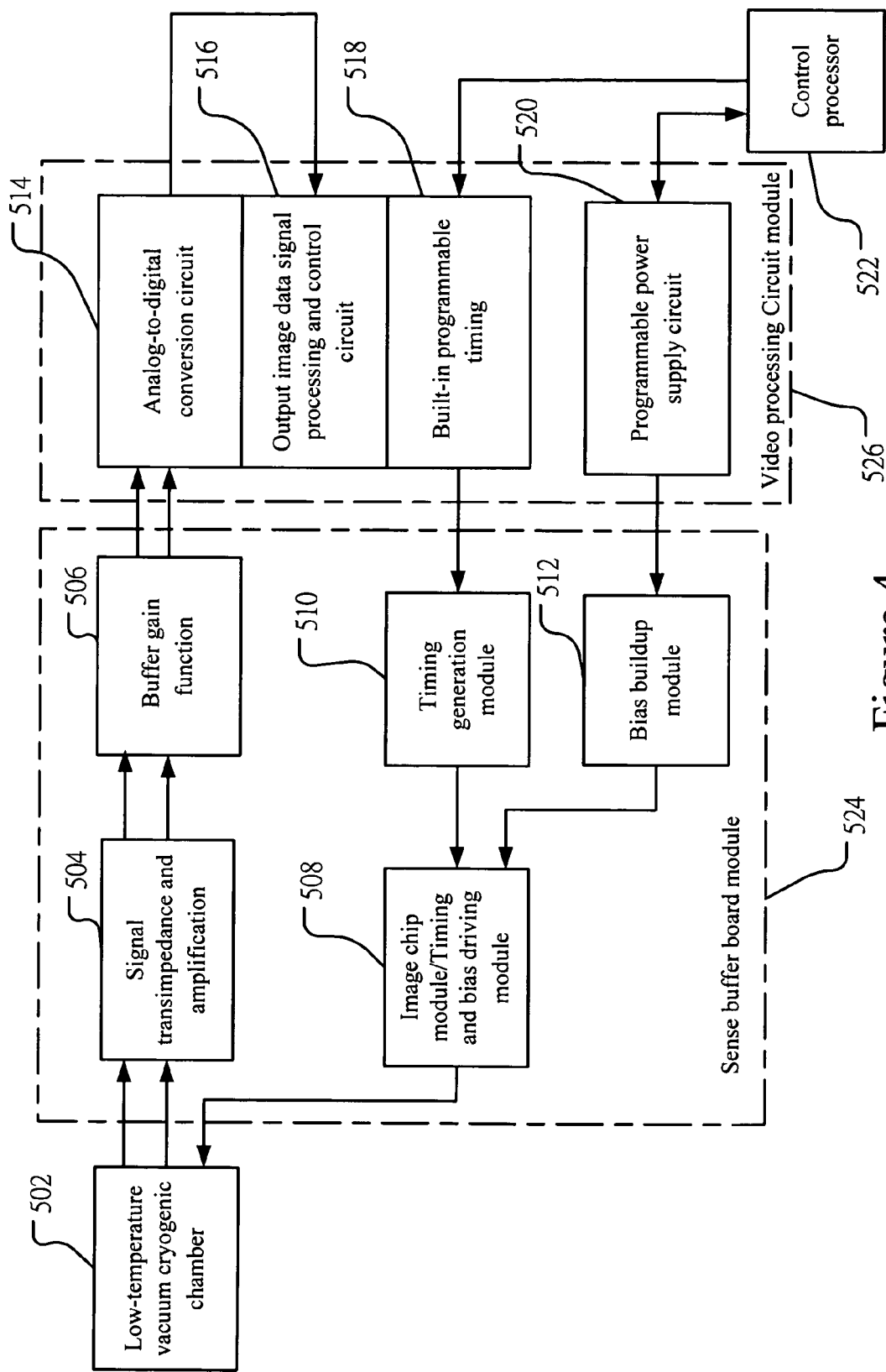
FIG. 4 shows a block diagram of an infrared thermal imaging array module according to a preferred embodiment of the present invention.

FIG. 4 shows a block diagram of an infrared thermal imaging array module according to a preferred embodiment of the present invention. As shown in the figure, after finishing, place the focal-plane array module to the low-temperature vacuum cryogenic chamber 502. Firstly, perform timing driving procedure 510, whose purpose is to provide the focal-plane array module a normal operation condition so the output signals maintains normal operating mode. At this moment, use a digital oscilloscope to intercept the image analog output terminal in the sensor buffer board 24 for confirming the requested output signal format. The signal frame of the jointing resistance between the focal-plane array and the ROIC at room temperature is tested for understand elementarily the jointing condition. Then, the temperature is set to the appropriate operating range of the IR thermal imaging array module to be verified, which is between 40K and 300K. When the temperature is stabilized at the set temperature for at least 15 minutes, perform adjustment of applied bias for module operation 512. The absolute value 508 of the converted bias across the sensing device is between 10 mV and 4V. The integration time in the ROIC is adjusted to be between 10 μsec and 32 msec. The function of signal transimpedance, amplification, and compensation 504 and of buffer gain 506 depends on backend amplification and compensation circuits. When the above significant adjusting parameters are adjusted such that the image sensing module observes monotone, middle frequency band, and warm background, the raw image signal appears grey scales on the display.

Meanwhile, continue using the oscilloscope to monitor the image output signal so that it displays greater dynamic values in response to temperature changes. In the video processing system 526, signal analog-to-digital conversion 514, signal data processing storage and interface control 516, built-in programmable timing 518, and programmable power supply circuit 520 are adapted as well. In addition, the main timing can be supplied by the computer via the VME bus transmission chain. The whole commands and image signal output architecture can connect to the Bit I/F interface card of the control processor 522 in the main computer as the command and I/O function. Next, install IR optical lens to the focal length (F# is 1.5~3.5) in front of the sensing module. Verification of integrated test (including optomechanical system) on thermal image quality 50 performs fine-tuning of parameters. Finally, perform image signal linear compensation for low- and high-temperatures for calibrating the dynamic image uniformity.

Figure 5:
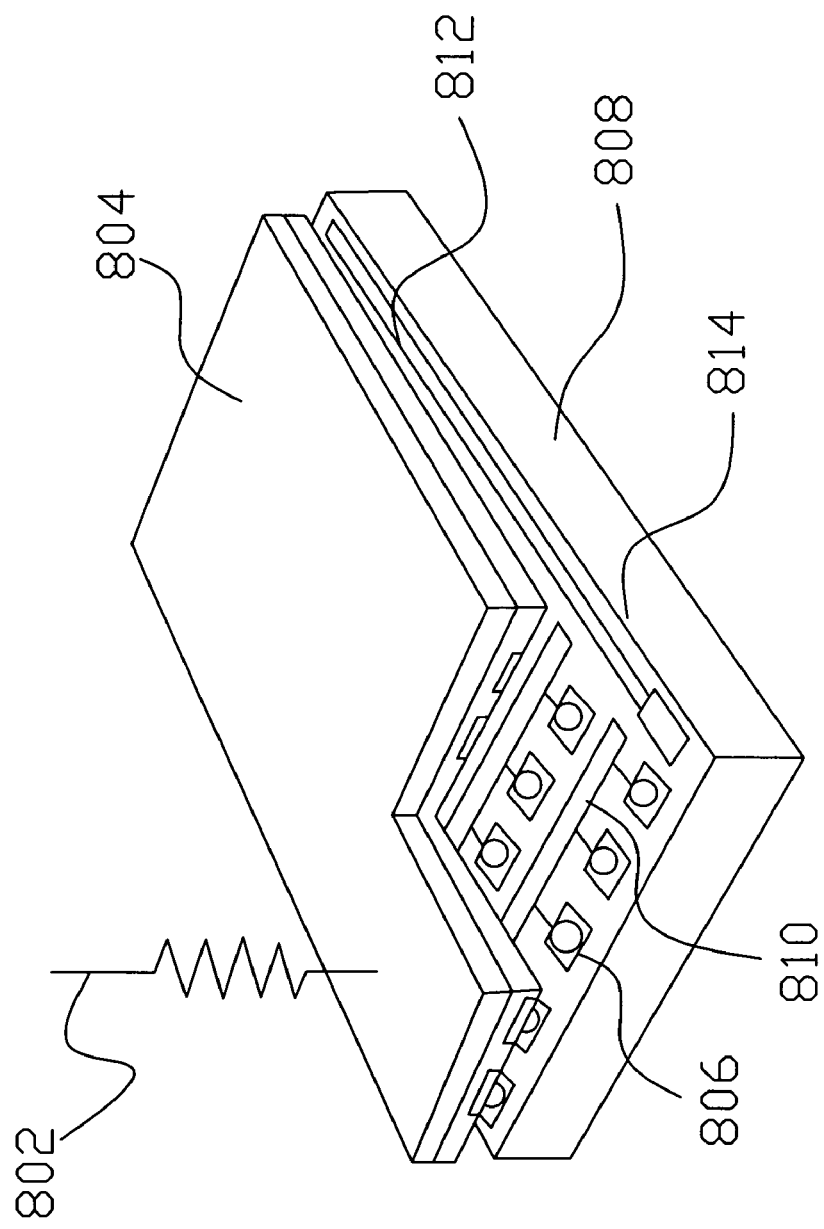
FIG. 5 shows a three-dimensional view of an infrared thermal imaging array module according to a preferred embodiment of the present invention.

FIG. 5 shows a three-dimensional view of an infrared thermal imaging array module according to a preferred embodiment of the present invention. As shown in the figure, after the image adjustment procedure, it is verified that in the IR thermal imaging array module, the focal-plane sensing array and the ROIC receive IR signal 802 by the light-receiving region 804 at the back of the sensing module. The ROIC 808 joints with the focal-plane sensing array at the photocurrent input terminal 806 of the ROIC by indium bonding. The photocurrent in each of the array unit stores to the integration capacitor 1020. The signal is sent to the sense buffer board module 524 and the video processing system circuit module 526 for performing image signal processing procedures by means of the column- 810 and row-multiplexer, sequentially, via the signal input terminal 814. The temperature of the cryogenic operation of the focal-plane array is controlled within 40~150K±0.5K. The inner vacuum pressure in the package is 10E-5~5E-2 torr. After two-point uniformity image quality compensation, the image frame uniformity is greater than 98%. The operation rate of the FPA module detecting unit is greater than 95%. Thereby, a set of the prototype 60 of thermal imaging module is completed.

To sum up, the verification architecture of an infrared thermal imaging array module and a method for manufacturing the same according to the present invention include the following steps. Perform specification design of thermal imaging module, epitaxy, and verification of optical characteristics for calibrating epitaxial parameters by using short, middle, and long IR absorption frequency bands. If the verification is passed, perform a fabrication process of single-device-type sensing device and verification of changing-temperature optoelectronic measurement. If the verification is passed, perform a fabrication process of focal-plane array and verification of optoelectronic uniformity thereof for testing dark current uniformity, otherwise, return back to specification design of thermal imaging module, epitaxy, and verification of optical characteristics. If the verification is passed, perform a fabrication process and verification of jointing and thinning the focal-plane array and a read-out integrated circuit (ROIC), otherwise, return back to specification design of thermal imaging module, epitaxy, and verification of optical characteristics. When the verification is passed, continue to perform the fabrication process and verification of jointing and thinning the focal-plane array and the ROIC. The focal-plane sensing module and the ROIC are jointed by indium bonding, and optoelectronic signal conversion is performed using the sensing array module. If the verification is passed, perform verification of integrated test (including optomechanical system) on thermal image quality, otherwise, return back to the fabrication process of focal-plane array and verification of optoelectronic uniformity thereof. When the verification is passed, continue to perform the verification of integrated test (including optomechanical system) on thermal image quality. Optimum driving and controlling output parameters are tuned for performing analysis and test on thermal image quality of the module. If the verification is passed, manufacture a prototype of the thermal imaging array module, otherwise, return back to the fabrication process and verification of jointing and thinning the focal-plane array and the ROIC. When the verification is passed, continue to manufacture the prototype of the thermal imaging array module, which is jointed with the focal-plane sensing array by indium bonding. Thereby, the prototype of the thermal imaging array module is completed.

Accordingly, the present invention conforms to the legal requirements owing to its novelty, unobviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A verification architecture of an infrared thermal imaging array module, which includes:
    a sensing frequency band, using short, middle, and long IR absorption frequency bands;
    a sensing module IR transmission substrate, selecting quality of the sensing module, namely, influencing IR transmission rate of receiving frequency band;
    a bottom heavily-doped contact layer, influencing quality of the ohmic contact between semiconductor and conducting metal;
    an IR absorption layer, namely, an active layer, the periodicity thereof influencing photoconductivity gain and quantum efficiency;
    an intrinsic layer, namely, a depletion layer, the thickness and intrinsic concentration thereof influencing quantum efficiency and dark current of the sensing device;
    an energy-barrier blocking layer, influencing intrinsic impedance of the sensing device for complying with high-injection photo-current efficiency, dark current of the sensing device, and activation energy under operation temperatures;
    a top heavily-doped contact layer, influencing characteristics of ohmic contact and output efficiency of photoelectron current;
    a fabrication process of single-device-type sensing device, which include the error between photomasks and linewidth of physical devices being less than 10%; and
    a verification architecture of changing-temperature optoelectronic measurement, the error rate under 10~300K operation temperatures being less than 15%, and the resultant spectrum type uniformity being greater than 80%.

2. The verification architecture of claim 1, wherein the epitaxy architecture of the semiconductor and the conducting metal is the architecture for Molecular Beam Epitaxy (MBE), Metal Organic Chemical Vapor Deposition (MOCVD), or High-Temperature Diffusion Oven (HTDO).

3. The verification architecture of claim 1, wherein the IR absorption layer of the verification architecture is designed as a quantum confined structure.

4. The verification architecture of claim 1, wherein the material of the semiconductor substrate is chosen from the group consisting GaAs, InP, $Al_2O_3$, Si, and SiC doped to be semi-insulating or N-type.

5. The verification architecture of claim 1, wherein the substrate for the verification architecture is IV family, such as Silicon (Si), or III-V family, such as GaAs or InP, and bulk-type sensing materials includes InSb, MCT, and InP.

6. The verification architecture of claim 1, wherein the diffusion material of the P-layer in the P-I-N structure with the intrinsic layer includes ZnAs compound, Zn, and Cd.

7. The verification architecture of claim 1, wherein the verification architecture of optical characteristics comprises:
    a calibration architecture of material deposition rate, by using Reflection High-Energy Electron Diffraction (RHEED) or quartz oscillation frequency test with error rate of deposition rate between 0.01 and 0.5 nm;
    an inspection architecture for completeness of periodicity structure, by using low-angle dual-lattice a X-ray diffractometer, a photo-excited fluorescent test, or a tunneling electron microscope, the uniformity of periodicity structure after regression calculations being greater than 95%;
    an inspection architecture for structure crystals, by using low-angle dual-lattice a X-ray diffractometer, the uniformity of structural crystals (single-crystal or polycrystalline) being greater than 90%; and
    a calibration architecture for polarity and doping concentration, by using C-V method, low-temperature hall measurement, and secondary ion mass spectrometry (SIMS) with identification rate of polarity and the calibration error of doping concentration being greater than 98% and being less than five times, respectively.

8. The verification architecture of claim 1, wherein the etching solution of the fabrication process of single-device-type sensing device contains weakly acid low-PH solution: Hydrogen Peroxide: Deionized (DI) water=2~5:1~2:5~20.

9. The verification architecture of claim 1, wherein the etching depth of the single-device-type sensing device is the thickness between the upper layer of the layered device structure and the layer producing electron-hole pairs.

10. The verification architecture of claim 1, wherein the set stable temperature and time in the Rapid Thermal Annealing (RTA) process of the verification of changing-temperature optoelectronic measurement are 350~500° C. for 15~60 sec, respectively.

11. The verification architecture of claim 1, wherein the intrinsic layer is a non-device region for avoiding lateral spreading currents.

12. The verification architecture of claim 1, wherein the planar-type device region of the sensing device is a P-type diffusion defined at high temperatures (with diffusion depth being 0.5~5 μm), then surface-polishing (with aluminum oxide power with diameters 1~5 μm, and aluminum oxide power: DI water=1:2~5) to 0.25~2 μm for forming preferred P-type region.

13. The verification architecture of claim 1, wherein the mesa-type device region of the sensing device is a etching region defined by using photomasks, wherein the depth of the etching region needs to exceed the bottom heavily doped region by ⅓~½ in thickness, diffusing the P-type at high temperatures (with diffusion depth being 0.5~5 μm), then surface-polishing (with aluminum oxide power with diameters 1~5 μm, and aluminum oxide power: DI water=1:2~5) to 0.25~2 μm for forming preferred P-type region.

14. The verification architecture of claim 1, wherein the quantum well structure of the sensing device is a etching region defined by using the photomasks, wherein the depth of the etching region needs to exceed the bottom heavily doped region by ⅓~½ in thickness, and adding periodic grating structure, which is one-dimensional stripe-shaped, or two-dimensional rectangular or rhombus-shaped, and the spacing and height of the grating are 1~5 μm and 10~500 nm, respectively.

15. A verification architecture of an infrared thermal imaging array module, which includes:
- a cryogenic operated focal-plane array, the temperature of the cryogenic operation being controlled within 40~150K±0.5K, the inner vacuum pressure in the package being 10E-5~5E-2 torr, after two-point uniformity image quality compensation, the image frame uniformity being greater than 98%, and the operation rate of the FPA module detecting unit being greater than 95%, the linewidth error for each of detecting unit uniformity being less than 10%, and the total photocurrent uniformity in spectrum response being greater than 75%;
- a signal sample and hold unit, stored in an integration capacitor, namely, the sensed signal-to-noise ratios (SNR);
- an injection unit, injecting charge signal in the integration capacitor to an output terminal;
- an amplifier module unit, amplifying the signal;
- a row-multiplexer and a column-multiplexer, sensing locations of units and extract sequentially;
- a timing generation and control unit, controlling access time and signal integration time from a main timing;
- a low-temperature vacuum cryogenic chamber, the focal-plane array and an ROIC chip module, a filter, and a cold shielding tube being placed therein, jointing with an IR lens from outside;
- a sense buffer board module, being the interface driving module between the focal-plane array and the ROIC chip module and the image processing module; and
- a video processing circuit module, processing and outputting image data signals;
- a control processor, controlling the whole commands and image data signal output, and being connected to a main computer.

16. The verification architecture of claim 15, wherein the injection unit is composed of at least four Metal-Oxide-Semiconductor Field-effect Transistors (MOSFETs) and an integration capacitor.

17. The verification architecture of claim 15, wherein the ROIC can perform buffering, direct injection, gate modulation, capacitor transimpedance and amplification.

18. The verification architecture of claim 15, wherein the video processing circuit module includes:
- an analog-to-digital conversion circuit, converting an analog signal to a digital signal;
- an output image data signal processing and controlling circuit, outputting image data according to a signal processing and controlling circuit;
- a programmable timing generation circuit, generating a timing signal; and
- a programmable power supply circuit, supplying power to the control processor.

19. The verification architecture of claim 15, wherein the main timing is supplied by the computer via the VME bus transmission chain, and the whole commands and image data signal output architecture can connect to the Bit I/F interface card of the control processor in the main computer as the command and I/O function.

* * * * *